(12) United States Patent
Rossi et al.

(10) Patent No.: US 9,772,645 B2
(45) Date of Patent: *Sep. 26, 2017

(54) TRANSMISSION CHANNEL FOR ULTRASOUND APPLICATIONS

(71) Applicant: STMicroelectronics S.r.l., Agrate Brianza (IT)

(72) Inventors: Sandro Rossi, Pavia (IT); Davide Ugo Ghisu, Milan (IT); Fabio Quaglia, Pizzale (IT); Antonio Davide Leone, Pieve Emanuele (IT)

(73) Assignee: STMICROELECTRONICS S.R.L, Agrate Brianza (IT)

( * ) Notice: Subject to any disclaimer, the term of this patent is extended or adjusted under 35 U.S.C. 154(b) by 0 days.

This patent is subject to a terminal disclaimer.

(21) Appl. No.: 15/076,211

(22) Filed: Mar. 21, 2016

(65) Prior Publication Data

US 2016/0204778 A1    Jul. 14, 2016

Related U.S. Application Data

(63) Continuation of application No. 14/553,749, filed on Nov. 25, 2014, now Pat. No. 9,323,270.

(51) Int. Cl.
*H03K 17/16* (2006.01)
*G05F 3/02* (2006.01)
*B06B 1/02* (2006.01)
*H03K 4/94* (2006.01)

(52) U.S. Cl.
CPC ............. *G05F 3/02* (2013.01); *B06B 1/0215* (2013.01); *H03K 4/94* (2013.01); *H03K 17/162* (2013.01)

(58) Field of Classification Search
USPC ........................ 327/108–109; 326/82, 85, 87
See application file for complete search history.

(56) References Cited

U.S. PATENT DOCUMENTS

| 6,366,125 | B1 | 4/2002 | Rochard |
| 6,856,175 | B2 * | 2/2005 | Wodnicki ............. H03K 17/163 327/108 |
| 7,692,456 | B2 * | 4/2010 | Hanazawa ............ H02M 7/538 327/108 |

(Continued)

FOREIGN PATENT DOCUMENTS

WO    2011/079882 A1    7/2011

OTHER PUBLICATIONS

Bianchi et al., "High-voltage integrated Class-B amplifier for ultrasound transducers," IC Design & Technology (ICICDT), 2013 International Conference, May 2013, pp. 105-108.

(Continued)

*Primary Examiner* — An Luu
(74) *Attorney, Agent, or Firm* — Seed IP Law Group LLP

(57) ABSTRACT

A transmission channel transmits high-voltage pulses and receives echos of the high-voltage pulses. The transmission channel includes a current generator circuit, which generates current-integrator drive currents. The control circuitry generates one or more control signals to control generation of current-integrator drive currents by the current generator circuit during transducer-driving periods. A current integrator integrates current-integrator drive currents generated by current generator circuit to generate transducer drive signals.

26 Claims, 9 Drawing Sheets

(56) References Cited

U.S. PATENT DOCUMENTS

| | | |
|---|---|---|
| 8,648,629 B2 | 2/2014 | Rossi et al. |
| 8,710,874 B2 | 4/2014 | Rossi et al. |
| 2007/0014190 A1 | 1/2007 | Fehl et al. |
| 2009/0206676 A1 | 8/2009 | Chu et al. |

OTHER PUBLICATIONS

Bianchi et al., "Analysis and Design of a High Voltage Integrated Class-B Amplifier for Ultra-Sound Transducers," IEEE Transactions on Circuits and Systems I: Regular Papers, 2014, pp. 1-10.

* cited by examiner

TRANSMISSION CHANNEL FOR ULTRASOUND APPLICATIONS

BACKGROUND

Technical Field

The present disclosure relates to transmission channels, such as transmission channels for ultrasound applications.

Description of the Related Art

Sonography or ultrasonography is a system of medical diagnostic testing that uses ultrasonic waves or ultrasounds and is based on the principle of the transmission of the ultrasounds and of the emission of echo and is widely used in the internistic, surgical and radiological fields.

The ultrasounds normally used are, for example, between 1 and 20 MHz in frequency. The frequency is chosen by taking into consideration that higher frequencies have a greater image resolving power, but penetrate less in depth in the subject under examination.

These ultrasounds may typically be generated by a piezo-ceramic crystal inserted in a probe maintained in direct contact with the skin of the subject with the interposition of a suitable gel (being suitable for eliminating the air between probe and subject's skin, allowing the ultrasounds to penetrate in the anatomic segment under examination). The same probe is typically able to collect a return signal or echo, which may be suitably processed by a computer and displayed on a monitor.

The ultrasounds that reach a variation point of the acoustic impedance, and thus for example an internal organ, are partially reflected and the reflected percentage conveys information about the impedance difference between the crossed tissues. It is to be noted that, the big impedance difference between a bone and a tissue being considered, with the sonography it is generally not possible to see behind a bone, which causes a total reflection of the ultrasounds, while air or gas zones give "shade", causing a partial reflection of the ultrasounds.

The time employed by an ultrasonic wave for carrying out the path of going, reflection and return is provided to the computer, which calculates the depth wherefrom the echo has come, thus identifying the division surface between the crossed tissues (corresponding to the variation point of the acoustic impedance and thus to the depth wherefrom the echo comes).

Substantially, an ultrasonographer, in particular a diagnostic apparatus based on the ultrasound sonography, may essentially comprise three parts:

a probe comprising at least one transducer, for example of the ultrasonic type, which transmits and receives an ultrasound signal;

an electronic system that drives the transducer for the generation of the ultrasound signal or pulse to be transmitted and receives an echo signal of return at the probe of this pulse, processing in consequence the received echo signal; and a displaying system of a corresponding sonography image processed based on the echo signal received by the probe.

The word transducer generally indicates an electric or electronic device that converts a type of energy relative to mechanical and physical quantities into electric signals. In a broad sense, a transducer is sometimes defined as any device that converts energy from one form to another, so that this latter can be re-processed, for example by men or by other machines. Many transducers are both sensors and actuators. An ultrasonic transducer usually comprises a piezoelectric crystal that is suitably biased for causing its deformation and the generation of the ultrasound signal or pulse.

A typical transmission channel or TX channel being used in these applications is schematically shown in FIG. 1. It allows to reach 5 levels output. The transmission channel 1 comprises an input logic 2 that drives, in correspondence with an input bus $BUS_{IN}$, a level shifter 3, in turn connected to a high voltage buffer block 4. The high voltage buffer block 4 is electrically coupled between pairs of high voltage reference terminals, respectively higher voltage reference terminals HVP0 and HVP1 and lower voltage reference terminals HVM0 and HVM1, and has a pair of input terminals, INB1 and INB2, connected to the level shifter 3, as well as a pair of output terminals, OUTB1 and OUTB2, connected to a corresponding pair of input terminals, INC1 and INC2 of a clamping block 5.

Furthermore, the clamping block 5 is connected to a clamp voltage reference terminal PGND and has an output terminal corresponding to a first output terminal HVout of the transmission channel 1, in turn connected, through an anti-noise block 6, to a connection terminal Xdcr for the transducer to be driven through the transmission channel 1.

A high voltage switch 7 is electrically coupled between the connection terminal Xdcr and a second output terminal LVout of the transmission channel 1. This high voltage switch 7 is able to transmit an output signal being at the output of the anti-noise block 6 to the second output terminal LVout during the receiving step of the transmission channel 1.

It is to be noted that the switch 7 is a high voltage one since, during the transmission step of the transmission channel 1, a signal being on the connection terminal Xdcr is a high voltage signal although the switch 7 is off. When this switch 7 is instead on, e.g., during the reception step of the transmission channel 1, the signal Xdcr is generally at a voltage value next to zero since the piezoelectric transducer connected to the transmission channel 1 is sensing small return echoes of ultrasound pulse signals, as shown in FIG. 2.

Typically, an ultrasonic transducer transmits a high voltage pulse of the duration of tens of ns, and listens for reception of the echo of this pulse, generated by the reflection on the organs of a subject under examination, for the duration of hundreds of µs, to go back to the transmission of a new high voltage pulse.

For example, a first pulse IM1 and a second pulse IM2 are transmitted with a peak to peak excursion equal, in the example shown, to 190 Vpp with reception by the transducer of corresponding echoes shown in FIG. 2 and indicated with E1 and E2.

The high voltage switch 7 is shown in greater detail in FIG. 3A, while its equivalent circuit according to working conditions (ON) is shown in FIG. 3B.

The high voltage switch 7 comprises a first switching transistor MS1 and a second switching transistor MS2, being electrically coupled, in series to each other, between the connection terminal Xdcr and the second output terminal LVout of the transmission channel 1 and having respective control or gate terminals connected, at the turning-on of the switch 7 itself, to a first and to a second supply voltage reference terminals, VDD_M and VDD_P respectively. FIG. 3A also shows the equivalent diodes, DS1 and DS2, of the switching transistors, MS1 and MS2, as well as their gate-source capacitances, Cg1 and Cg2 respectively.

The first capacitance Cg1 of the first switching transistor MS1 is connected between the corresponding gate terminal, in turn connected to the first supply voltage reference terminal VDD_M and a first switching node XS1, corresponding to a source terminal of the first switching transistor MS1. Similarly, the second capacitance Cg2 of the second switching transistor MS2 is connected between the relative gate terminal, in turn connected to the second supply voltage reference terminal VDD_P and a second switching node XS2, corresponding to a source terminal of the second switching transistor MS2.

As shown in the equivalent circuit of FIG. 3B, when the high voltage switch 7 is on and thus the gate terminals of the switching transistors MS1 and MS2 are connected to the first VDD_M and to the second supply voltage reference terminal VDD_P as indicated in FIG. 3A (which in FIG. 3B, for sake of simplicity, have been shown as a single reference voltage, for example, ground, being these first and second supply voltage references), these switching transistors behave as respective resistances R1 and R2, that are electrically coupled between the connection terminal Xdcr and the second output terminal LVout of the transmission channel 1 (the second output terminal LVout coinciding with the second switching node XS2) and interconnected in correspondence with the first switching node XS1.

According to these conditions, the first capacitance Cg1 is connected between the first connection node XS1 and the first supply voltage reference VDD_M, while the second capacitance Cg2 is connected between the second connection node XS2 and the second supply voltage reference VDD_P. The first and second supply voltage references are fixed supplies, and are shown for sake of simplicity in FIG. 3B as a single reference voltage, the ground GND. This parallel capacitance introduces a strong mitigation of the signal at the input of the high voltage switch 7, e.g., of the signal at the output of the transmission channel 1 after the anti-noise block 6.

In general, the switch 7 should be a high voltage switch so as not to break during transmission of high-voltage driving pulses to the load.

Further, the high voltage buffer block 4 comprises a first branch comprising a first buffer transistor MB1 and a first buffer diode DB1, being electrically coupled, in series to each other, between a first higher voltage reference terminal HVP0 and a buffer central node XBc, as well as a second buffer diode DB2 and a second buffer transistor MB2, electrically coupled, in series to each other, between the buffer central node XBc and a first lower voltage reference terminal HVM0. The first and second buffer transistors, MB1 and MB2, have respective control or gate terminals in correspondence with a first XB1 and with a second inner circuit node XB2 of the high voltage buffer block 4 and connected to, and driven by, a first DRB1 and a second buffer input driver DRB2, in turn connected to the level shifter 3 in correspondence with the first and second input terminals, INB1 and INB2, of the high voltage buffer block 4.

The high voltage buffer block 4 also comprises, in parallel to the first branch, a second branch in turn comprising a third buffer transistor MB3 and a third buffer diode DB3, being electrically coupled, in series to each other, between a second higher voltage reference terminal HVP1 and the buffer central node XBc, as well as a fourth buffer diode DB4 and a fourth buffer transistor MB4, electrically coupled, in series to each other, between the buffer central node XBc and a second lower voltage reference terminal HVM1. The third and fourth buffer transistors, MB3 and MB4, have respective control or gate terminals in correspondence with a third XB3 and a fourth inner circuit node XB4 of the high voltage buffer block 4 and connected to, and driven by, a third DRB3 and a fourth buffer input driver DRB4, in turn connected to the first XB1 and to the second inner circuit node XB2 and then to the first DRB1 and to the second buffer input driver DRB2, respectively, as well as to a first OUTB1 and to a second output terminal OUTB2.

In the example of the figure, the first and third buffer transistors, MB1 and MB3, are high voltage P-channel MOS transistors (HV Pmos) while the second and fourth buffer transistors, MB2 and MB4, are high voltage N-channel MOS transistors (HV Nmos). Moreover, the buffer diodes, DB1, DB2, DB3 and DB4, are high voltage diodes (HV diode).

The clamping block 5 has in turn a first INC1 and a second input terminal INC2, respectively connected to the first OUTB1 and second output terminal OUTB2 of the high voltage buffer block 4.

The clamping block 5 comprises a first clamp driver DRC1 connected between the first input terminal INC1 and a control or gate terminal of a first clamp transistor MC1, in turn electrically coupled, in series with a first clamp diode DC1, between the clamp voltage reference terminal PGND, for example a ground, and a clamp central node XCc. The first clamp transistor MC1 and the first clamp diode DC1 are interconnected in correspondence with a first clamp circuit node XC1.

The clamping block 5 also comprises a second clamp driver DRC2 connected between the second input terminal INC2 and a control or gate terminal of a second clamp transistor MC2, in turn electrically coupled, in series with a second clamp diode DC2, between the clamp central node XCc and the clamp voltage reference terminal PGND. The second clamp transistor MC2 and the second clamp diode DC2 are interconnected in correspondence with a second clamp circuit node XC2.

The clamp central node XCc is also connected to the first output terminal HVout of the transmission channel 1, in turn connected to the connection terminal Xdcr through an anti-noise block 6 comprising respective first and second anti-noise diodes, DN1 and DN2, connected in antiparallel, e.g., by having the anode terminal of the first diode connected to the cathode terminal of the second diode and vice versa, between the first output terminal HVout and the connection terminal Xdcr.

In the example of FIG. 1, the first clamp transistor MC1 is a high voltage P-channel MOS transistor (HV Pmos) while the second clamp transistor MC2 is a high voltage N-channel MOS transistor (HV Nmos). Moreover, the clamp diodes, DC1 and DC2, are high voltage diodes (HV diode).

The clamping block 5 is also shown in FIG. 4, in the case of a clamping operation to a ground voltage reference GND, e.g., during the receiving step of the transmission channel 1. It is to be noted that the clamping to the ground voltage reference GND generally should be ensured also when the load is mainly capacitive. In this case, the output terminal of the transmission channel should generally be brought back to this ground value after the transmission.

Furthermore, the clamping to the ground is generally desirable in applications in which the high voltage wave form to be transmitted, besides oscillating between a positive value of high voltage and a negative value of high voltage, stays for determined periods of time at the ground value. Also the anti-noise block 6 is indicated too, being connected between the first output terminal HVout and the connection terminal Xdcr of the transmission channel 1.

FIG. 4 also shows the equivalent diodes, DMC1 and DMC2, of the clamp transistors, MC1 and MC2, respectively, the first and second clamp input drivers, DRC1 and DRC2, being connected between a first clamp supply voltage reference terminal and a second clamp supply voltage reference terminal, higher VDD_P and lower VDD_M, respectively, and the ground GND, whereto also the clamp central node XCc is connected.

FIG. 1 shows a classical pulser half-bridge scheme typically employed in ultrasound applications. In operation, this architecture brings the node Xdcr to different voltage levels through two or more half-bridges operating between voltage levels, for example, HVP0, HVM0, HVP1, HVM1 and PGND. In such a configuration, it is possible to obtain N-levels, two for each half-bridge. The CLAMP 5 facilitates returning to the transducer voltage PGND, adding another layer. The transducer LOAD 8 is driven in voltage across the on resistance of the DMOS (e.g., MB1, MB2, MB3, MB4). With this type of architecture it is possible to stimulate the transducers with rectangular waveforms or stairway waveforms, as shown in FIG. 5.

BRIEF SUMMARY

Rectangular and stairway waveforms provide a good compromise between simplicity, power consumption and performance. Such waveforms, however, have a large spectrum, and the limited bandwidth of a typical transducer may result in significant power loss. Distortion may be introduced, for example, by the second harmonic component, which may render such waveforms unsuitable for some applications. Transmission channels such as that shown in FIG. 1 also employ a significant number of high-voltage power supplies to drive a transducer with a multilevel signal. In addition, most of the circuitry needs to be capable of operating at high voltage, which limits the ability to integrate the components into an integrated circuit, and a high-voltage switch with an aggressive performance is typically used to protect the receiver which typically operates at a low-voltage.

High-end applications may employ structures with high-voltage linear amplifiers or transformers, in order to generate analog waveforms. These approaches facilitate transmitting most of the power on the first harmonic at the expense of others (including the second), and facilitate avoiding interference between adjacent transducers. Moreover, it allows to optimize the apodization among different TX channels better focusing the TX wave. However, the use of multiple high-voltage linear amplifiers and/or transformers may introduce significant cost, power and space requirements, and usually require the substantial use of discrete topologies.

The use of high-voltage components also negatively impacts the performance of the receiver circuits. High-voltage MOS components also typically have poor match characteristics, which can lead to mismatch between rising and falling edges.

In an embodiment, a device comprises: a current generator circuit, which, in operation, generates current-integrator drive currents; a receiver, which, in operation, amplifies transducer-echo signals; and control circuitry, which, in operation, generates one or more control signals to control: generation of current-integrator drive currents by the current generator circuit during transducer-driving periods; and reception of transducer-echo signals by the receiver during echo-reception periods. In an embodiment, the device comprises: a first switch; and a second switch, wherein, the current generator circuit comprises a first plurality of current generators and a second plurality of current generators; the first switch is coupled between the first plurality of current generators and an output of the current generator circuit; the second switch is coupled between the second plurality of current generators and the output of the current generator circuit; and the control circuitry, in operation, generates one or more control signals to selectively close the first and second switches during transducer-driving periods. In an embodiment, the control circuitry, in operation, generates one or more control signals to close only one of the first and second switches at a time. In an embodiment, the control circuitry, in operation, generates one or more control signals to control magnitudes of current generated by the first and second pluralities of current generators. In an embodiment, the control circuitry, in operation, generates one or more control signals to control magnitudes and directions of current-integrator drive currents generated by the current generator circuit. In an embodiment, the device comprises an integrated circuit including the current generator circuit and the control circuitry. In an embodiment, the integrated circuit includes the receiver. In an embodiment, the device comprises a current integrator, which, in operation, integrates current-integrator drive currents generated by current generator circuit to generate transducer drive signals. In an embodiment, the current integrator comprises a high-voltage amplifier and a first capacitor. In an embodiment, the receiver comprises a second current integrator including a low-voltage amplifier and a second capacitor. In an embodiment, the control circuitry, in operation, receives and processes transducer-echo signals amplified by the receiver. In an embodiment, the device comprises: a receiver switch, wherein in operation, the control circuitry generates at least one control signal to open the receiver switch during transducer-driving periods and to close the receiver switch during echo-reception periods.

In an embodiment, a system comprises: a transducer; and a transmission channel, which, in operation, is coupled to the transducer, the transmission channel including: a current generator circuit, which, in operation, generates current-integrator drive currents; a current integrator, which, in operation, integrates current-integrator drive currents generated by current generator circuit to generate transducer drive signals; a receiver, which, in operation, amplifies transducer-echo signals; and control circuitry, which, in operation, generates one or more control signals to control: generation of current-integrator drive currents by the current generator circuit during transducer-driving periods; and reception of transducer-echo signals by the receiver during echo-reception periods. In an embodiment, the transmission channel comprises: a first current-generator switch; a second current-generator switch; and a receiver switch, wherein, the current generator circuit comprises at least one first current generator and at least one second current generator; the first current-generator switch is coupled between the at least one first current generator and an input of the current integrator; the second current-generator switch is coupled between the at least one second current generator and the input of the current integrator; the receiver switch is coupled between the input of the current integrator and an input of the receiver; and the control circuitry, in operation, generates one or more control signals to: selectively close the first and second current generator switches during transducer-driving periods; open the receiver switch during transducer-driving periods; and close the receiver switch during echo-reception periods. In an embodiment, the control circuitry, in operation, generates one or more control signals to control magnitudes and directions of current-integrator drive currents generated by the current generator circuit. In an embodiment, the current integrator comprises a high-voltage amplifier and a first capacitor. In an embodiment, the receiver comprises a second current integrator including a low-voltage amplifier and a second capacitor. In an embodiment, the system comprises: a system base, which, in operation, is coupled to the transducer through the transmission channel. In an embodiment, the transducer comprises a piezoceramic crystal and the transmission channel, in operation, transmits ultrasonic pulses to the transducer during transducer-driving periods. In an embodiment, the system comprises an integrated circuit including the current generator circuit, the receiver and the control circuitry.

In an embodiment, a method comprises: isolating an echo-receiver from a transducer during a transducer-driving period; generating a current-integrator drive current during the transducer-driving period; integrating the current-integrator drive current to generate a transducer-drive signal during the transducer-driving period; and coupling the echo-receiver to the transducer during a transducer-echo reception period following the transducer-driving period. In an embodiment, the generating the current-integrator drive current comprises controlling magnitudes and directions of current generated by a current generator circuit. In an embodiment, the controlling magnitudes and directions of current generated by the current generator circuit comprises generating control signals to control first and second current-generator switches. In an embodiment, the method comprises generating control signals to control a receiver switch coupled between the current integrator and the echo-receiver.

In an embodiment, a non-transitory computer-readable medium's contents cause control circuitry to control a method, the method comprising: isolating an echo-receiver from a transducer during a transducer-driving period; generating a current-integrator drive current during the transducer-driving period; integrating the current-integrator drive current to generate a transducer-drive signal during the transducer-driving period; and coupling the echo-receiver to the transducer during a transducer-echo reception period following the transducer-driving period. In an embodiment, the generating the current-integrator drive current comprises controlling magnitudes and directions of current generated by a current generator circuit. In an embodiment, the method comprises generating control signals to control a receiver switch coupled between the current integrator and the echo-receiver.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations, such as, for example, integrated circuits, operational amplifiers, capacitors, diodes, drivers, etc., are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 6:
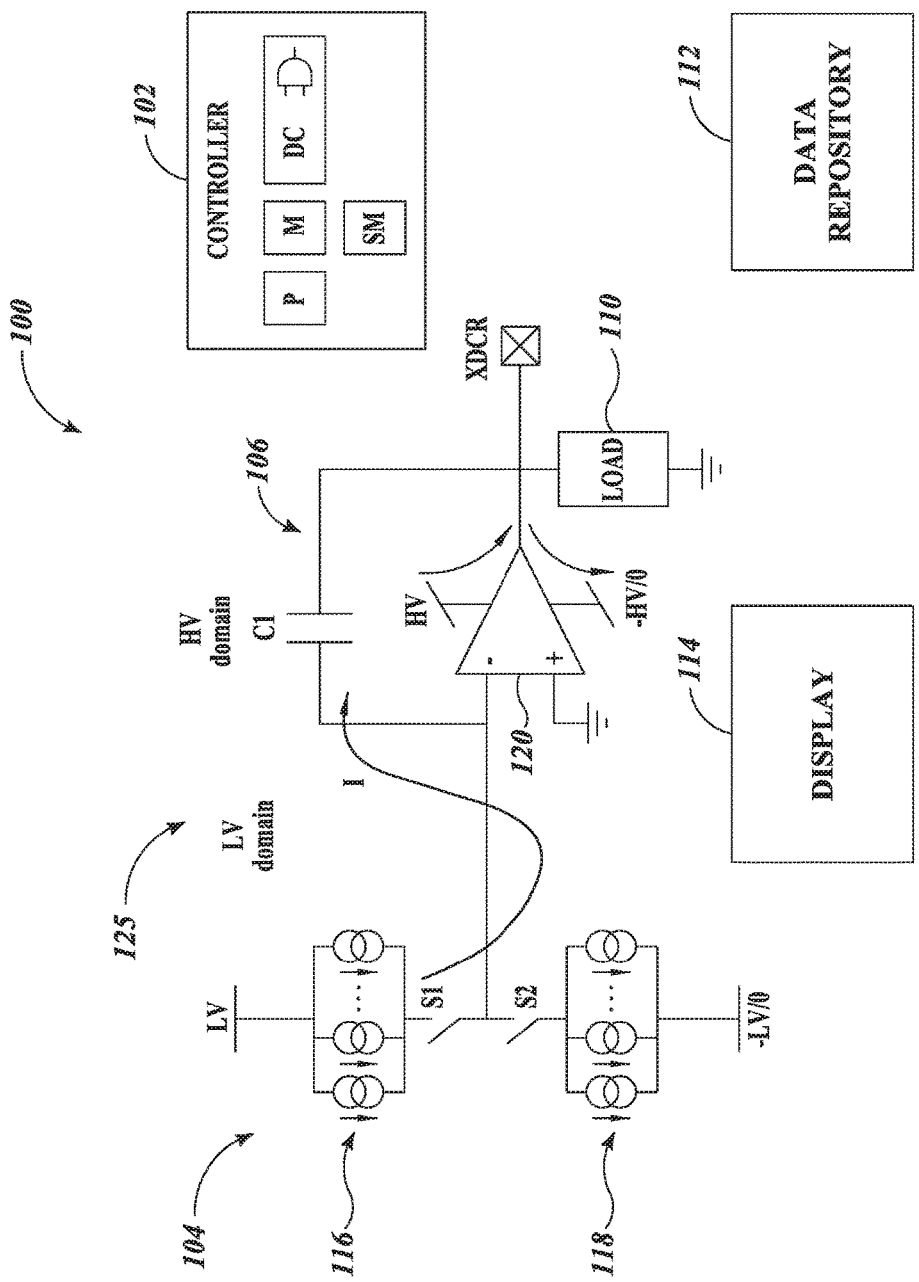
FIG. 6 schematically shows a transmission channel, for example for ultrasound applications, according to an embodiment.

An embodiment of a system 100 is schematically shown in FIG. 6. The system 100 comprises a controller 102, a current generator circuit 104, a high-voltage amplification stage 106, switches S1, S2, a load 110, such as a transducer, a data repository 112 and a display 114. The controller 102, the current generator circuit 104, switches S1, S2, and the high-voltage amplification stage 106 form a transmission channel 125 to transmit drive signals to the load 110.

The controller 102 includes control circuitry which as illustrated comprises one or more processors P, one or more memories M, discrete circuitry DC (such as logic gates, capacitors, resistors, etc.), and one or more state machines SM. The controller 102 generates control signals to control, for example, the current generator 104, the high voltage amplification stage 106, and the display 114. Embodiments of the controller 102 may comprise fewer components than illustrated, may comprise more components than illustrated, and may employ components alone or in various combinations to perform the various functions of the controller 102. For example, instructions stored in the memory M may be executed by the processor P to perform a function of the controller 102, one or more state machines may be employed to generate control signals to control switches S1, S2, etc., and various combinations thereof. In some embodiments, the controller may receive data signals, such as an output signal from a receiver (see, e.g., low voltage amplification stage 108 of FIG. 8), and generate data and/or control signals based on the received data signals. For example, the controller 102 may generate control signals to cause the display 114 to display images based on a data signal (e.g., an amplified echo signal received from a receiver), may generate data based on a data signal (e.g., an amplified echo signal received from a receiver) and control the storage of the generated data in the data repository 112, etc. In some embodiments, the controller 102 may receive data or program files, or combinations thereof, from the data repository 112 and generate control signals based on the received files.

The current generator circuit 104 as illustrated comprises a first plurality of current generators 116 coupled together in parallel between a first voltage node LV and a first terminal of the switch S1, and a second plurality of current generators 118 coupled together in parallel between a second voltage node −LV/0 and a first terminal of the switch S2. The second terminals of the switches S1 and S2 are coupled to an output of the current generator circuit 104. The switches S1, S2 may be low-voltage switches. The current generators 116, 118 may be low-voltage current generators. In some embodiments, a pair of current generators may be employed instead of the first and second pluralities of current generators 116, 118.

In operation, the controller 102 generates control signals to control the switches S1, S2, for example to control the generation of a driving current to drive the high-voltage amplification stage 106 during transducer-driving periods. As discussed in more detail elsewhere herein, the high-voltage amplification stage 106, during transducer-driving periods, integrates the driving current to generate a transducer-driving signal.

In some embodiments, the controller 102 may in operation generate control signals to control the current generated by the first and second pluralities of current generators 116, 118. For example, the controller 102 may selectively activate or deactivate current generators of the first and second pluralities of current generators 116, 118. For example, additional switches (not shown) may be controlled to turn individual current generators on or off, control signals may be provided to control the amount of current provided by each of the plurality of generators (e.g., controlling the amount of current using a current mirror configuration, etc.). As illustrated, with switch S1 closed, the first plurality of current generators feed a current I to the high-voltage amplification stage 106.

In operation, the first voltage node LV of the current generator circuit 104 may be coupled to a low voltage supply (e.g., ±2.5 volts, ±5 volts, ±12 volts, etc.), and the second voltage node of the current generator circuit 104 may be coupled to a ground or a low voltage supply (e.g., ±2.5 volts, ±5 volts, ±12 volts, etc.). For example, the first voltage node may be coupled to +5 volts DC, and the second voltage node may be coupled to −5 volts DC, the first voltage node may be coupled to +5 volts DC, and the second voltage node may be coupled to ground, etc.

The high-voltage amplification stage 106 as illustrated comprises a high-voltage amplifier 120 and a first capacitor C1. The negative input of the high-voltage amplifier 120 is coupled to the output of the current generator circuit 104. The first capacitor C1 is coupled between an output of the high-voltage amplifier 120 and the negative input of the high-voltage amplifier 120. The positive input of the high-voltage amplifier 120 is coupled to a reference voltage, such as a ground. The output of the high-voltage amplifier 120 is coupled to a transducer node XDCR, which in operation is coupled to the load 110, such as a transducer. In operation, the high-voltage amplifier 120 may be supplied by a high-voltage supply (e.g., ±120 volts, ±240 volts, etc.) For example, a first supply node HV of the high-voltage amplifier may be coupled to +240 volts DC, and a second supply node −HV/0 may be coupled to −240 volts DC, the first supply node HV may be coupled to +240 volts DC, and the second supply node −HV/0 may be coupled to ground, etc.

The load 110, in operation, is coupled to the transducer node XDCR. The load 110 may comprise, for example, a transducer, such as a piezoelectric crystal that may be suitably biased for causing its deformation and the generation of the ultrasound signal or pulse.

The data repository 112 may comprise any suitable storage medium for storing data, such as a hard disk, a RAM, etc. The data repository may store, for example, instructions for loading into a memory M of the controller 102, which may be executed by a processor P of the controller 102 to generate control signals, data generated based on a signal from a receiver, etc., and various combinations thereof.

The display 114 may comprise any known display for displaying images generated based on a transducer signal, such as ultrasonic images. In operation, the controller 102, a separate or integrated receiver (see low voltage amplification stage 108 of FIG. 8), etc., and various combinations thereof, may generate signals to cause the display to display images.

In operation, switches S1 and S2 may be controlled to bring the transducer node XDCR to a desired voltage as a function of time, limited by the supply voltages of the high-voltage amplifier 120. The high-voltage amplification stage 106 in operation functions as a current integrator, e.g., according to:

$$XDCR = dV/dT = I/C1$$

Figure 7:
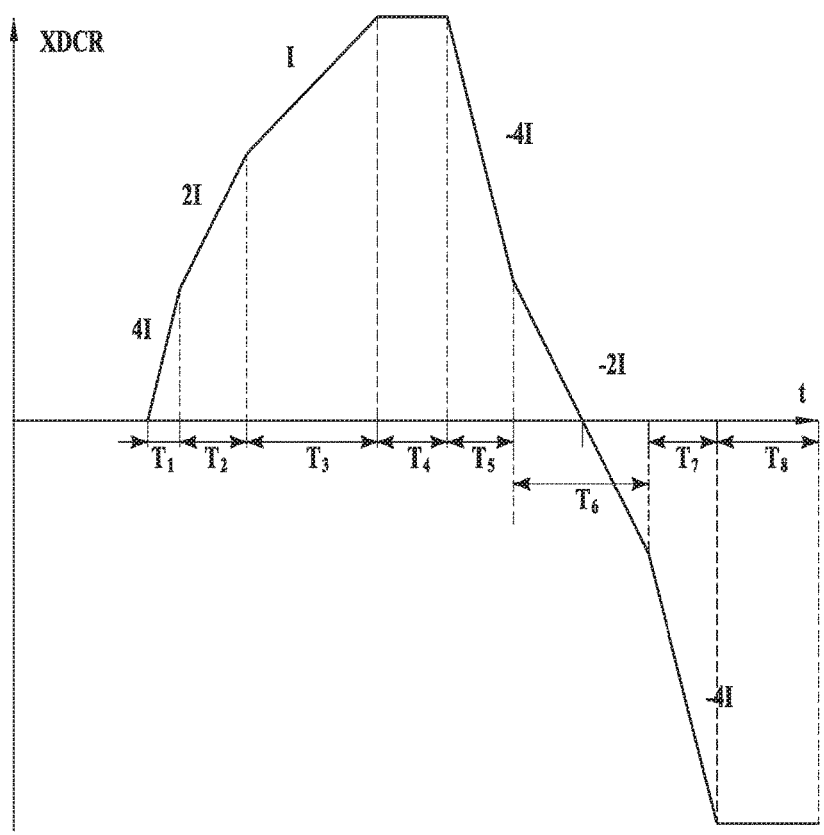
FIG. 7 shows an example waveform according to an embodiment.

An example of controlling the system 100 of FIG. 6 to produce a desired voltage wave form will be discussed with reference to the example waveform of FIG. 7. One of skill in the art will recognize that it is not always possible in practice to achieve ideal results. The system 100 may be controlled to produce other waveforms and in other manners to produce the same waveform.

During a first time period T1, S1 is closed and S2 is open, and the first plurality of current generators 116 is controlled to produce a current of +4I (e.g., four of the first plurality of current generators 116 are activated), causing a current of +4I to flow through the high-voltage amplification stage 106. This causes a voltage at the node XDCR to increase at a rate proportional to the current +4I.

During a second time period T2, S1 is closed and S2 is open, and the first plurality of current generators 116 is controlled to produce a current of +2I (e.g., two of the first plurality of current generators 116 are activated), causing a current of +2I to flow through the high-voltage amplification stage 106. This causes the voltage at the node XDCR to increase at a rate proportional to the current +2I.

During a third time period T3, S1 is closed and S2 is open, and the first plurality of current generators 116 is controlled to produce a current of +I (e.g., one of the first plurality of current generators 116 is activated), causing a current of +I to flow through the high-voltage amplification stage 106. This causes the voltage at the node XDCR to increase at a rate proportional to the current +I.

During a fourth time period T4, S1 is closed and S2 is open, and the first plurality of current generators 116 is controlled to produce a current of +I (e.g., one of the first plurality of current generators 116 is activated), causing a current of +I to flow through the high-voltage amplification stage 106. However, the voltage at the node XDCR does not continue to increase, for example, because a limit imposed by the high-voltage amplifier 120 configuration has been reached.

During a fifth time period T5, S2 is closed and S1 is open, and the second plurality of current generators 118 are controlled to produce a current of −4I (e.g., four of the second plurality of current generators 118 are activated), causing a current of −4I to flow through the high-voltage amplification stage 106. This causes the voltage at the node XDCR to decrease at a rate proportional to the current −4I.

During a sixth time period T6, S2 is closed and S1 is open, and the second plurality of current generators 118 are controlled to produce a current of −2I (e.g., two of the second plurality of current generators 118 are activated), causing a current of −2I to flow through the high-voltage amplification stage 106. This causes the voltage at the node XDCR to decrease at a rate proportional to the current −2I.

During a seventh time period T7, S2 is closed and S1 is open, and the second plurality of current generators 118 are controlled to produce a current of −4I (e.g., four of the second plurality of current generators 118 are activated), causing a current of −4I to flow through the high-voltage amplification stage 106. This causes the voltage at the node XDCR to decrease at a rate proportional to the current −4I.

During an eighth time period T8, S2 is closed and S1 is open, and the second plurality of current generators are controlled to produce a current of −4I (e.g., four of the second plurality of current generators 118 are activated), causing a current of −4I to flow through the high-voltage amplification stage 106. However, the voltage at the node XDCR does not continue to decrease, for example, because a limit imposed by the high-voltage amplifier 120 configuration has been reached.

In operation, when both S1 and S2 are open, no current is driven through the high-voltage amplification stage, and XDCR fails to zero. A signal received from the load 110 (e.g., an echo signal from a transducer) introduces a low-voltage signal at XDCR, which may be provided to a receiver (see low voltage amplification stage 108 of FIG. 8). It is noted that, in operation, before C1 only low-voltages are needed, which facilitates the use of low-voltage components and the coupling of the system 100 to a receiver.

In an embodiment, the system 100 may include one or more integrated circuits comprising the controller 102. In an embodiment, the one or more integrated circuits may include all or part of one or more of the current generator circuit 104, the high-voltage amplification stage 106, the data repository 112, the display 114, and the first, and second S1, S2. In an embodiment, the first capacitor C1 may be implemented using discrete circuitry. In an embodiment, all or part of the high-voltage amplifier 120 may be implemented using discrete circuitry. In an embodiment, all or part of the system 100 may be integrated into a transducer probe including the load 110. In an embodiment, the load 110 may comprise a piezoceramic crystal.

Figure 8:
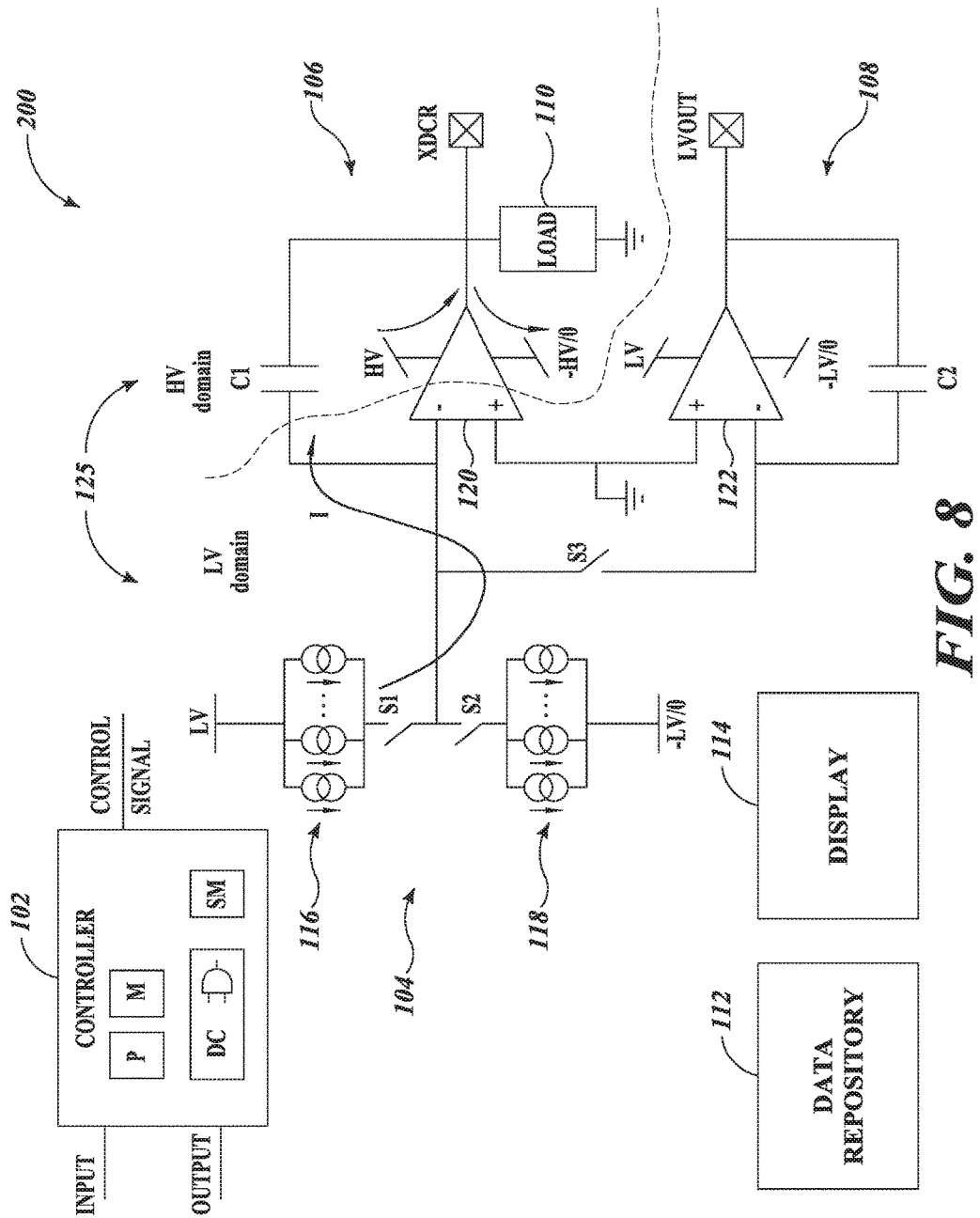
FIG. 8 schematically shows a transmission channel, for example for ultrasound applications, according to an embodiment.

An embodiment of a system 200 is schematically shown in FIG. 8. The system 200 comprises a controller 102, a current generator circuit 104, a high-voltage amplification stage 106, a low-voltage amplification stage 108, switches S1, S2, S3, a load 110, such as a transducer, a data repository 112 and a display 114. The controller 102, the current generator circuit 104, switches S1, S2, S3, the high-voltage amplification stage 106 and the low-voltage amplification stage 108 form a transmission channel 125 to transmit drive signals to, and receive echo signals from, the load 110.

The controller 102 includes control circuitry which as illustrated comprises one or more processors P, one or more memories M, discrete circuitry DC (such as logic gates, capacitors, resistors, etc.), and one or more state machines SM. The controller 102 generates control signals to control, for example, the current generator 104, the high voltage amplification stage 106, the low voltage amplification stage 108, and the display 114. Embodiments of the controller 102 may comprise fewer components than illustrated, may comprise more components than illustrated, and may employ components alone or in various combinations to perform the various functions of the controller 102. For example, instructions stored in the memory M may be executed by the processor P to perform a function of the controller 102, one or more state machines may be employed to generate control signals to control switches S1, S2, S3, etc., and various combinations thereof. In some embodiments, the controller may receive data signals, such as an output signal from the low voltage amplification stage 108, and generate data and/or control signals based on the received data signals. For example, the controller 102 may generate control signals to cause the display 114 to display images based on a data signal (e.g., an amplified echo signal received from low voltage amplification stage 108), may generate data based on a data signal (e.g., an amplified echo signal received from low voltage amplification stage 108) and control the storage of the generated data in the data repository 112, etc. In some embodiments, the controller 102 may receive data or program files, or combinations thereof, from the data repository 112 and generate control signals based on the received files.

The current generator circuit 104 as illustrated comprises a first plurality of current generators 116 coupled together in parallel between a first voltage node LV and a first terminal of a first switch S1, and a second plurality of current generators 118 coupled together in parallel between a second voltage node −LV/0 and a first terminal of a second switch S2. The second terminals of the first and second switches S1, S2 are coupled together and provide an output of the current generator circuit 104. The first and second switches S1, S2 may be low-voltage switches. The current generators 116, 118 may be low-voltage current generators. In some embodiments, a pair of current generators may be employed instead of the first and second pluralities of current generators 116, 118.

In operation, the controller 102 generates control signals to control the switches S1, S2, S3, for example to control the generation of a driving current to drive the high-voltage amplification stage 106 during transducer-driving periods and to control coupling of the low-voltage amplification stage 108 to the transducer during reception periods during which an echo-signal may be received (e.g., between transducer-driving periods). As discussed in more detail elsewhere herein, the high-voltage amplification stage 106, during transducer-driving periods, integrates the driving current to generate a transducer-driving signal.

In some embodiments, the controller 102 may in operation generate control signals to control the current generated by the first and second pluralities of current generators 116, 118. For example, the controller 102 may selectively activate or deactivate current generators of the first and second pluralities of current generators 116, 118. For example, additional switches (not shown) may be controlled to turn individual current generators on or off, control signals may be provided to control the amount of current provided by each of the plurality of generators (e.g., controlling the amount of current using a current mirror configuration, etc.). As illustrated, with the first switch S1 closed, and the second switch S2 and the third switch S3 open, the first plurality of current generators 116 are controlled to feed a current I to the high-voltage amplification stage 106.

In operation, the first voltage node LV of the current generator circuit 104 may be coupled to a low voltage supply (e.g., ±2.5 volts, ±5 volts, ±12 volts, etc.), and the second voltage node of the current generator circuit 104 may be coupled to a ground or a low voltage supply (e.g., ±2.5 volts, ±5 volts, ±12 volts, etc.). For example, the first voltage node may be coupled to +5 volts DC, and the second voltage node may be coupled to −5 volts DC, the first voltage node may be coupled to +5 volts DC, and the second voltage node may be coupled to ground, etc.

The high-voltage amplification stage 106 as illustrated comprises a high-voltage amplifier 120 and a first capacitor C1. The negative input of the high-voltage amplifier 120 is coupled to the output of the current generator circuit 104 and to a first terminal of the third switch S3. The first capacitor C1 is coupled between an output of the high-voltage amplifier 120 and the negative input of the high-voltage amplifier 120. The positive input of the high-voltage amplifier 120 is coupled to a reference voltage, such as a ground. The output of the high-voltage amplifier 120 is coupled to a transducer node XDCR, which in operation is coupled to the load 110, such as a transducer. In operation, the high-voltage amplifier 120 may be supplied by high-voltage supply (e.g., ±120 volts, ±240 volts, etc.) For example, a first supply node HV of the high-voltage amplifier may be coupled to +240 volts DC, and a second supply node −HV/0 may be coupled to −240 volts DC, the first supply node HV may be coupled to +240 volts DC, and the second supply node −HV/0 may be coupled to ground, etc.

The low-voltage amplification stage 108 as illustrated comprises a low-voltage amplifier 122 and a second capacitor C2. The negative input of the low-voltage amplifier 122 is coupled to the second terminal of the switch S3. The second capacitor C2 is coupled between an output of the low-voltage amplifier 122 and the negative input of the low-voltage amplifier 122. The positive input of the low-voltage amplifier 122 is coupled to the reference voltage. The output of the low-voltage amplifier 122 is coupled to a low-voltage output node LVOUT, which in operation may be coupled to another receiver (not shown), to the controller 102, etc., and various combinations thereof, to facilitate processing of an echo signal received at the transducer node XDCR and amplified by the low-voltage amplification stage 108. In operation, the low-voltage amplifier 122 may be supplied by low-voltage supply (e.g., ±2.5 volts, ±5 volts, ±12 volts, etc.) For example, a first supply node LV of the low-voltage amplifier 122 may be coupled to +5 volts DC, and a second supply node −LV/0 may be coupled to −5 volts DC, the first supply node LV may be coupled to +5 volts DC, and the second supply node −LV/0 may be coupled to ground, etc. The low-voltage amplification stage, in operation, receives and amplifies transducer-echo signals.

The load 110, in operation, is coupled to the transducer node XDCR. The load 110 may comprise, for example, a transducer, such as a piezoelectric crystal that may be suitably biased for causing its deformation and the generation of the ultrasound signal or pulse.

The data repository 112 may comprise any suitable storage medium for storing data, such as a hard disk, a RAM, etc. The data repository may store, for example, instructions for loading into a memory M of the controller 102, which may be executed by a processor P of the controller 102, data generated based on a signal at the low-voltage output node LVOUT, etc., and various combinations thereof.

The display 114 may comprise any known display for displaying images generated based on a transducer signal, such as ultrasonic images. In operation, the controller 102, a separate or integrated receiver (see low voltage amplification stage 108 of FIG. 8), etc., and various combinations thereof, may generate signals to cause the display to display images.

In operation, switch S3 is opened during transducer-driving periods to isolate the low-voltage amplification stage 108 from the high-voltage amplification stage 106. In operation, when switch S3 is open, switches S1 and S2 may be controlled to bring the transducer node XDCR to a desired voltage as a function of time, limited by characteristics of the high-voltage amplification stage 106, such as the supply voltages of the high-voltage amplifier 120. The high-voltage amplification stage 106 in operation functions as a current integrator, e.g. according to:

$$XDCR=dV/dT=I/C1$$

An example of controlling the system 200 of FIG. 8 to produce a desired voltage wave form will be discussed with reference to the example waveform of FIG. 7. One of skill in the art will recognize that it is not always possible in practice to achieve ideal results. The system 200 may be controlled to produce other waveforms and in other manners to produce the same waveform.

During a first time period T1, the first switch S1 is closed and the second and third switches S2, S3 are open, and the first plurality of current generators 116 are controlled to produce a current of +4I (e.g., four of the first plurality of current generators 116 are activated), causing a current of +4I to flow through the high-voltage amplification stage 106. This causes a voltage at the node XDCR to increase at a rate proportional to the current +4I.

During a second time period T2, the first switch S1 is closed and the second and third switches S2, S3 are open, and the first plurality of current generators 116 are controlled to produce a current of +2I (e.g., two of the first plurality of current generators 116 are activated), causing a current of +2I to flow through the high-voltage amplification stage 106. This causes the voltage at the node XDCR to increase at a rate proportional to the current +2I.

During a third time period T3, the first switch S1 is closed and the second and third switches S2, S3 are open, and the first plurality of current generators 116 are controlled to produce a current of +I (e.g., one of the first plurality of current generators 116 is activated), causing a current of +I to flow through the high-voltage amplification stage 106. This causes the voltage at the node XDCR to increase at a rate proportional to the current +I.

During a fourth time period T4, the first switch S1 is closed and the second and third switches S2, S3 are open, and the first plurality of current generators 116 are controlled to produce a current of +1I (e.g., one of the first plurality of current generators 116 is activated), causing a current of +I to flow through the high-voltage amplification stage 106. However, the voltage at the node XDCR does not continue to increase, for example, because a limit imposed by the high-voltage amplifier 120 configuration has been reached.

During a fifth time period T5, the second switch S2 is closed and the first and third switches S1, S3 are open, and the second plurality of current generators 118 are controlled to produce a current of −4I (e.g., four of the second plurality of current generators 118 are activated), causing a current of −4I to flow through the high-voltage amplification stage 106. This causes the voltage at the node XDCR to decrease at a rate proportional to the current −4I.

During a sixth time period T6, the second switch S2 is closed and the first and third switches S1, S3 are open, and the second plurality of current generators 118 are controlled to produce a current of −2I (e.g., two of the second plurality of current generators 118 are activated), causing a current of −2I to flow through the high-voltage amplification stage 106.

This causes the voltage at the node XDCR to decrease at a rate proportional to the current −2I.

During a seventh time period T7, the second switch S2 is closed and the first and third switches S1, S3 are open, and the second plurality of current generators 118 are controlled to produce a current of −4I (e.g., four of the second plurality of current generators 118 are activated), causing a current of −4I to flow through the high-voltage amplification stage 106. This causes the voltage at the node XDCR to decrease at a rate proportional to the current −4I.

During an eighth time period T8, the second switch S2 is closed and the first and third switches S1, S3 are open, and the second plurality of current generators 118 are controlled to produce a current of −4I (e.g., four of the second plurality of current generators 118 are activated), causing a current of −4I to flow through the high-voltage amplification stage 106. However, the voltage at the node XDCR does not continue to decrease, for example, because a limit imposed by the high-voltage amplifier 120 configuration has been reached.

In operation, the third switch S3 is closed and the first and second switches are opened during reception periods, such as when an echo-signal may be received from a transducer. In operation, during a reception period the third switch S3 is closed, the first and second switches S1, S2 are open, and no current is driven through the high-voltage amplification stage 106 by the current generator circuit 104, and XDCR fails to zero. A signal received from the load 110 (e.g., an echo signal from a transducer) may introduce a low-voltage signal at XDCR, which is amplified by the low voltage amplification stage 108 according to, for example:

$$LVOUT = XDCR * C1/C2$$

The first capacitor C1 in operation functions as part of the high-voltage amplification stage 106 when the high-voltage amplification stage is being driven by the current generator circuit 104, and functions as part of the low-voltage amplification stage 108 when an echo signal is received.

In an embodiment, the system 200 may include one or more integrated circuits comprising the controller 102. In an embodiment, the one or more integrated circuits may include all or part of one or more of the current generator circuit 104, the high-voltage amplification stage 106, the low-voltage amplification stage 108, the data repository 112, the display 114, and the first, second and third switches S1, S2, S3. In an embodiment, the first capacitor C1 may be implemented using discrete circuitry. In an embodiment, the second capacitor C2 may be implemented using discrete circuitry. In an embodiment, all or part of the high-voltage amplifier 120 may be implemented using discrete circuitry. In an embodiment, all or part of the system 200 may be integrated into a transducer probe including the load 110. In an embodiment, the load 110 may comprise a piezoceramic crystal.

Other switching configurations may be employed in various embodiments, and one of skill in the art will appreciate how to control such switches to produce desired waveforms after reviewing the discussion herein. For example, an additional switch (not shown) may be coupled between the second terminals of the first and second switches and the output of the current generator circuit 104. One of skill in the art will appreciate that such an additional switch may be closed in operation when the current generator circuit 104 is driving the high-voltage amplification stage 106, and open in operation to isolate the low-voltage amplification stage 108 from the current generator circuit 104.

Figure 1:
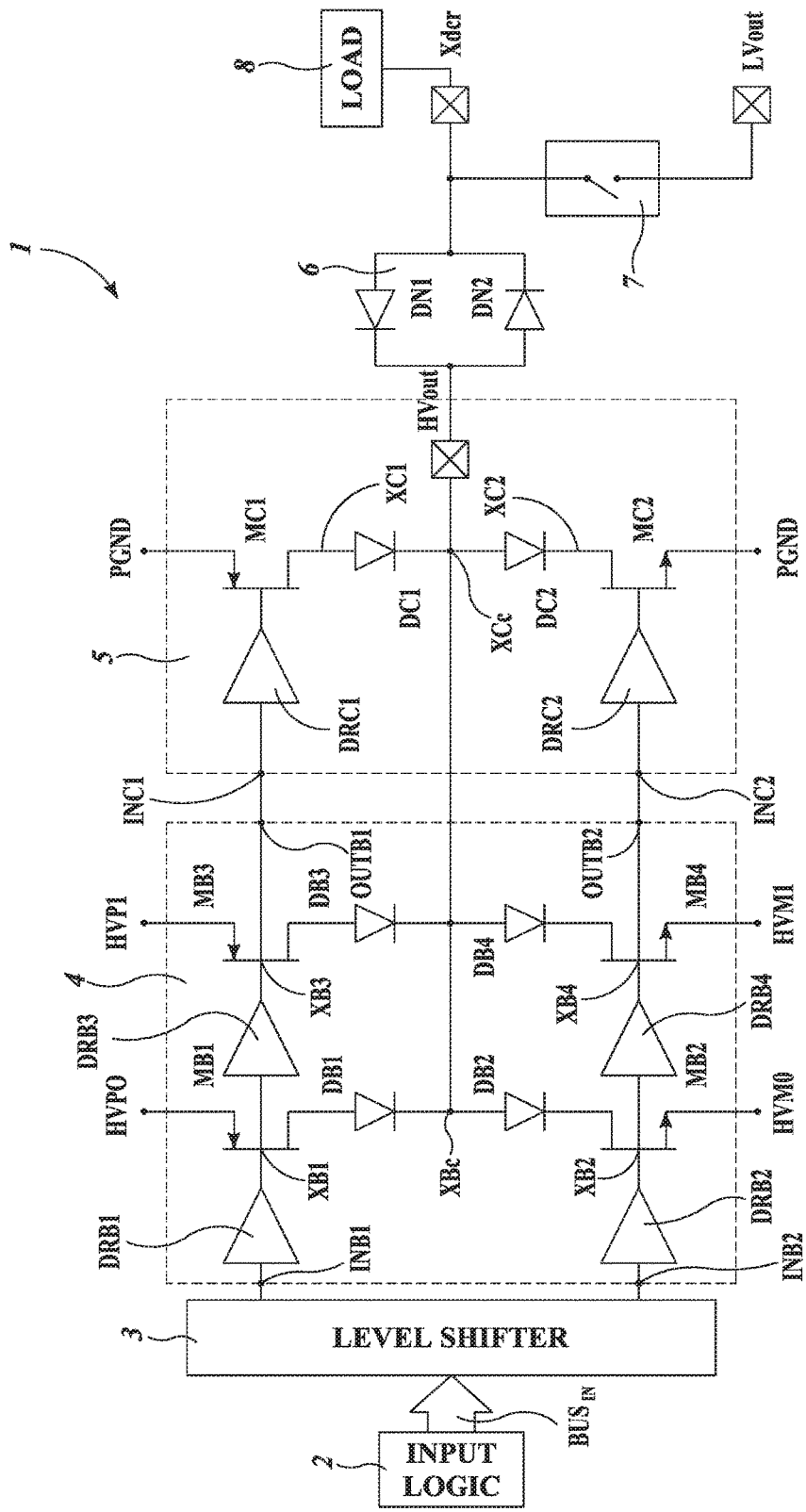
FIG. 1 schematically shows a transmission channel for ultrasound applications.
Figure 2:
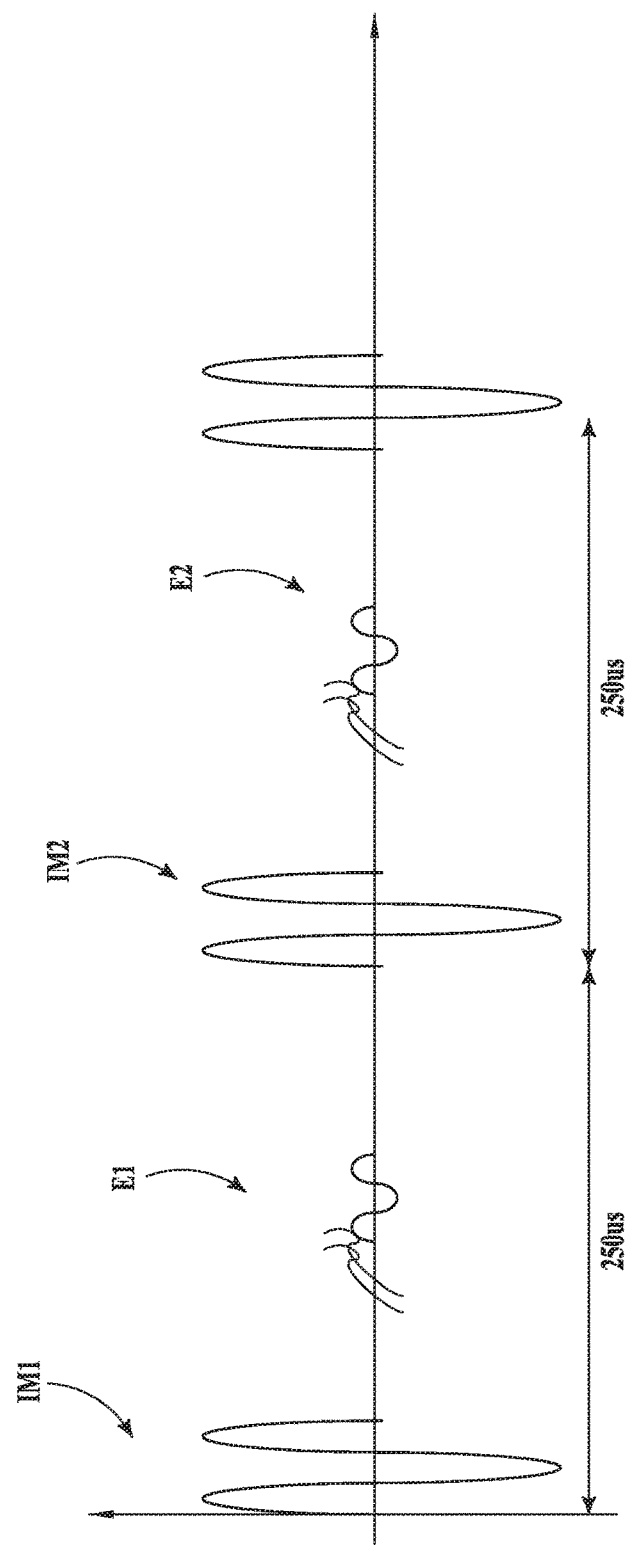
FIG. 2 schematically shows a first and a second ultrasound pulse used in an ultrasonic transducer.
Figure 3B:
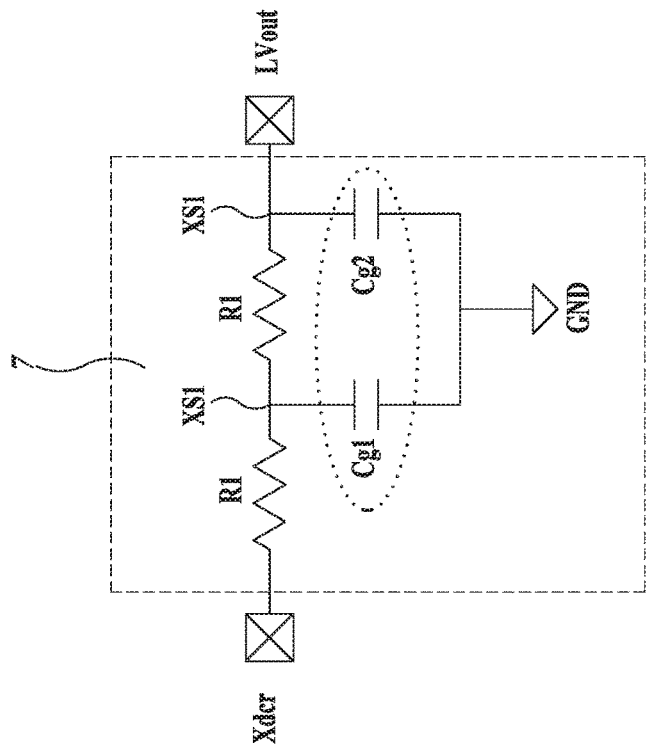
FIG. 3B shows an equivalent circuit of the switch of FIG. 3A under turn-on conditions.
Figure 3A:
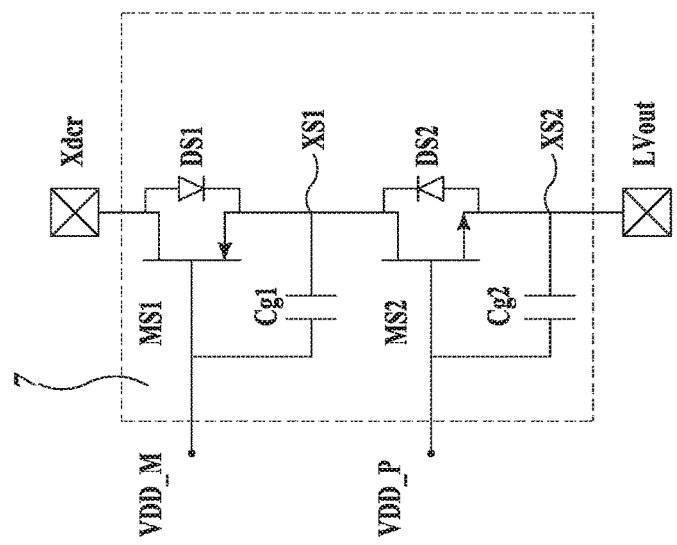
FIG. 3A shows in greater detail a high voltage switch during a turn-on step and being comprised within the transmission channel of FIG. 1.
Figure 4:
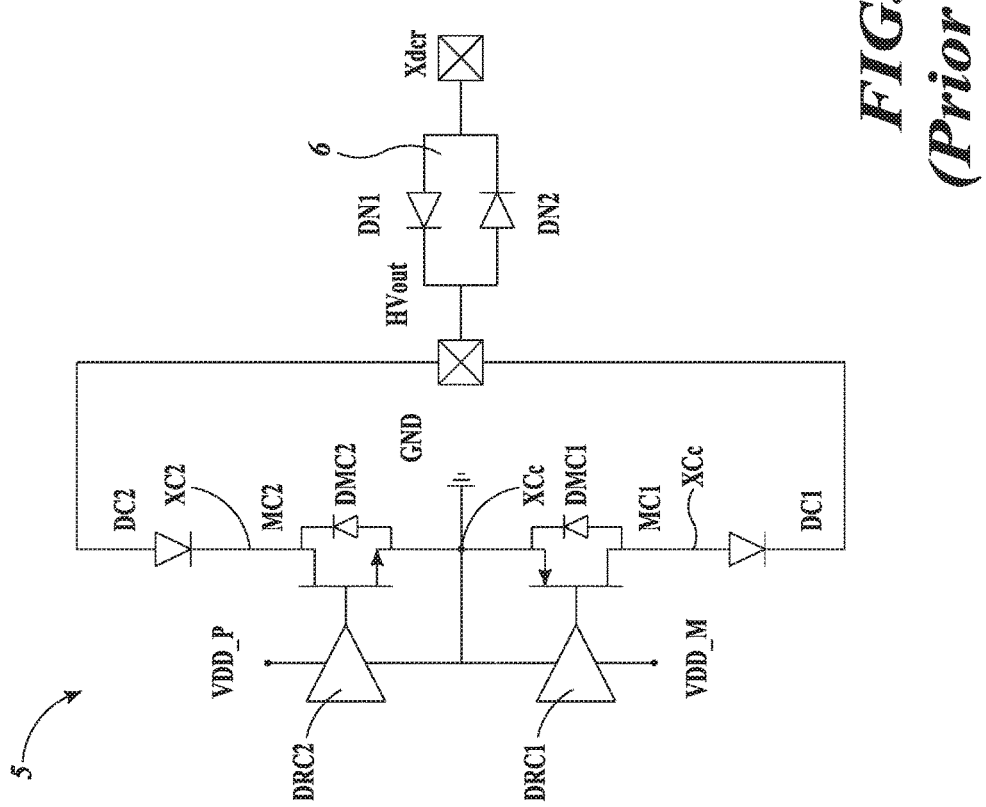
FIG. 4 shows in greater detail a block comprised within the transmission channel of FIG. 1.
Figure 5:
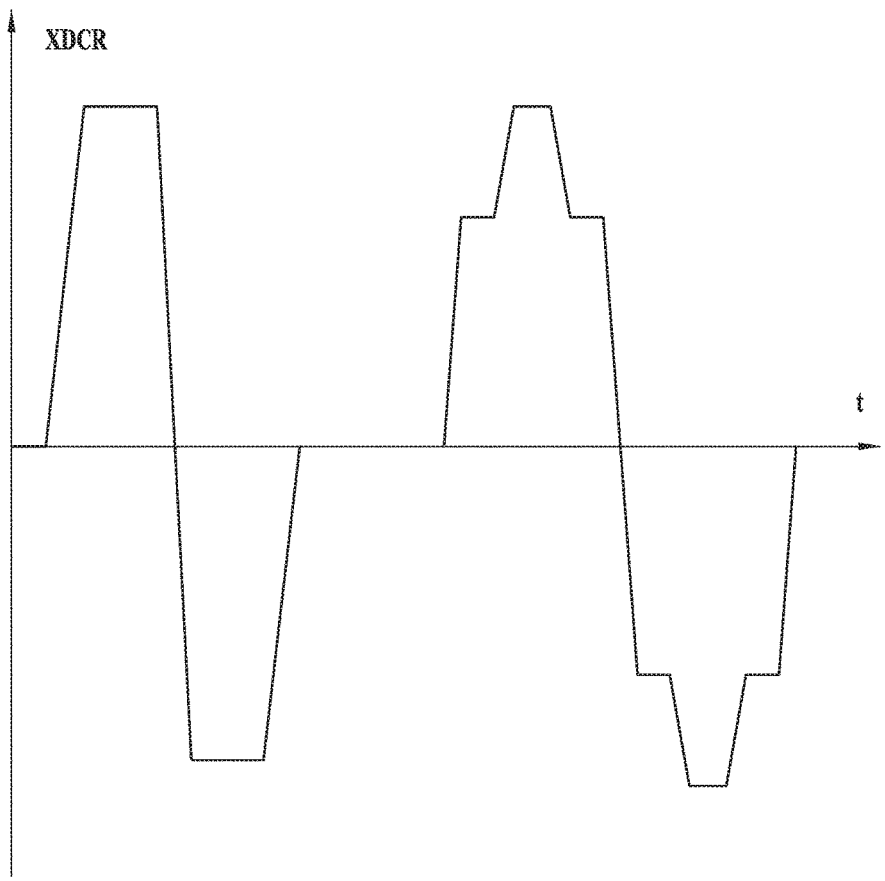
FIG. 5 schematically shows a rectangular ultrasonic pulse and a stairway ultrasound pulse used in an ultrasonic transducer.

One or more embodiments may facilitate the use of low-voltage components in all of the stages except the high voltage amplification stage, implementing the system using mostly integrated circuitry, simplifying the circuitry, generating signals with different shapes, eliminating high voltage switches (see switch 7 of FIG. 1) and clamps (see clamp 5 of FIG. 1), and reducing noise (capacitors are relatively noiseless compared to high voltage switches with high on-resistance). In an embodiment, the high-voltage components are used only to provide current to the load, which may reduce or eliminate concerns about matching the characteristics of the high-voltage components, and facilitate obtaining a high match between rising and falling edges of the signal provided to the load. An embodiment may facilitate controlling the power consumption using the control signals (e.g., by controlling the driving current provided to the high-voltage amplification stage). An embodiment may facilitate providing a capacitive isolation between the high-voltage and low-voltage domains of a transmission channel.

Figure 9:
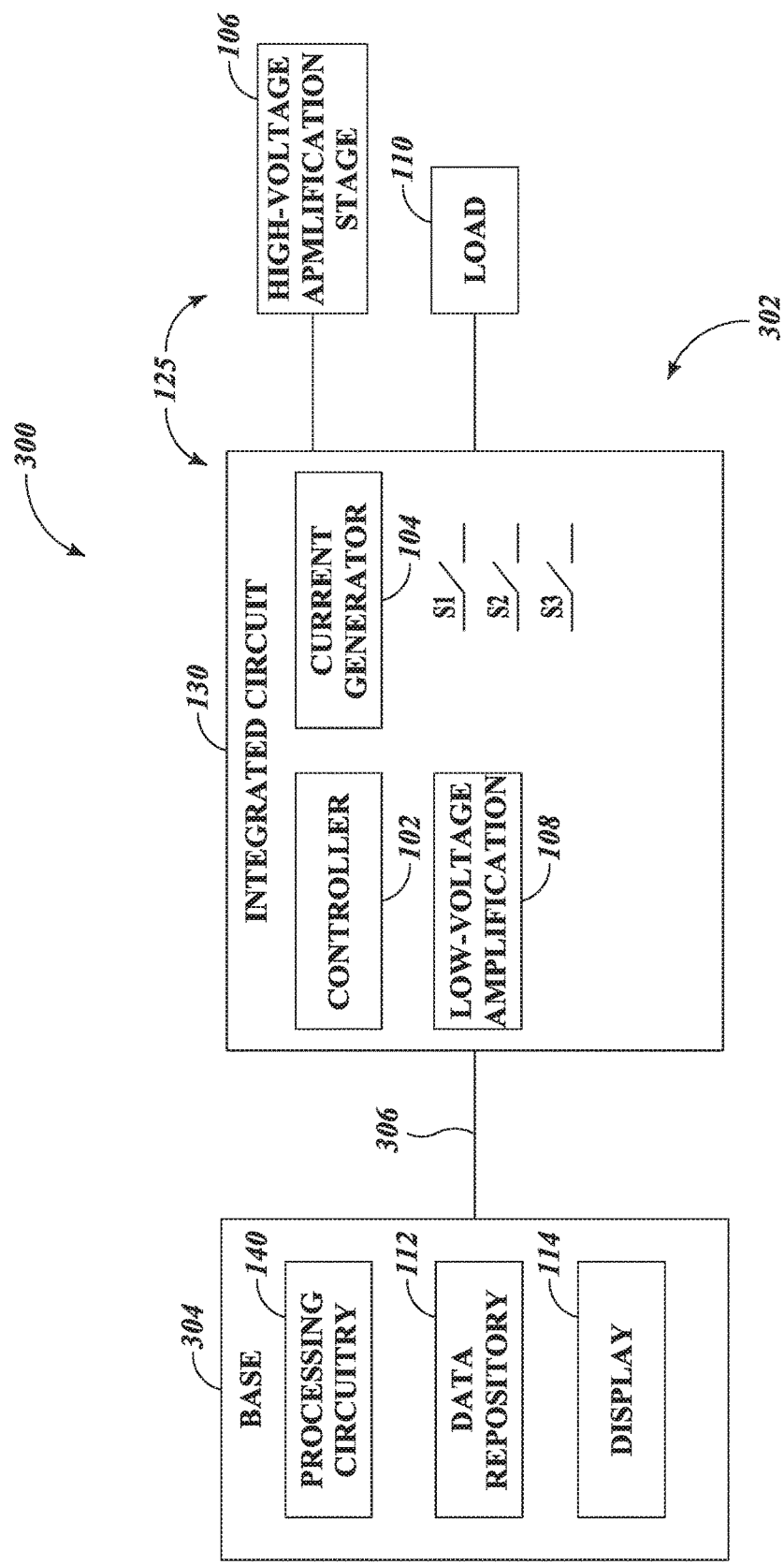
FIG. 9 schematically show a transducer system, for example for ultrasound applications, according to an embodiment.

FIG. 9 illustrates an embodiment of a system 300, which, for example, may implement an embodiment of the system 200 of FIG. 8. The system comprises a probe 302 and a system base 304 coupled together through a bus system 306. The probe 302 includes an integrated circuit 130, a high-voltage amplification stage 106 and a load 110. In some embodiments, the probe 302 may include all or part of the bus system 306. The integrated circuit 130 includes a controller 102, a current generator circuit 104, a low voltage amplification stage 108 and switches S1, S2, S3. The system base 304 includes processing circuitry, such as one or more processors, one or more memories, discrete circuitry, state machines, etc., a data repository 112 and a display 114. Some embodiments may not include all of the components illustrated in FIG. 9, may include additional components not shown in FIG. 9, may distribute components in a manner different than as shown in FIG. 9, and various combination thereof.

Some embodiments may take the form of computer program products. For example, according to one embodiment there is provided a computer readable medium comprising a computer program adapted to perform one or more of the methods described above. The medium may be a physical storage medium such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), discrete circuitry, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology. In some embodiments, some of the modules or controllers separately described herein may be combined, split into further modules and/or split and recombined in various manners.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a current generator circuit, which, in operation, generates current-integrator drive currents;
a current integrator circuit, which, in operation, integrates current-integrator drive currents generated by current generator circuit to generate transducer drive signals; and
control circuitry, which, in operation, generates one or more control signals to control generation of current-integrator drive currents by the current generator circuit during transducer-driving periods.

2. The device of claim 1, comprising:
a first switch; and
a second switch, wherein,
the current generator circuit comprises a first plurality of current generators and a second plurality of current generators;
the first switch is coupled between the first plurality of current generators and an output of the current generator circuit;
the second switch is coupled between the second plurality of current generators and the output of the current generator circuit; and
the control circuitry, in operation, generates one or more control signals to selectively close the first and second switches during transducer-driving periods.

3. The device of claim 2 wherein the control circuitry, in operation, generates one or more control signals to close only one of the first and second switches at a time.

4. The device of claim 2 wherein the control circuitry, in operation, generates one or more control signals to control magnitudes of currents generated by the first and second pluralities of current generators.

5. The device of claim 1 wherein the control circuitry, in operation, generates one or more control signals to control magnitudes and directions of current-integrator drive currents generated by the current generator circuit.

6. The device of claim 5, comprising:
an integrated circuit including the current generator circuit and the control circuitry.

7. The device of claim 6 wherein the integrated circuit includes the current integrator circuit.

8. The device of claim 1, comprising:
a receiver, which, in operation, amplifies transducer-echo signals received during echo-reception periods.

9. The device of claim 1 wherein the current integrator comprises a high-voltage amplifier and a first capacitor.

10. The device of claim 9, comprising:
a receiver including a second current integrator having a low-voltage amplifier and a second capacitor.

11. The device of claim 10 wherein the control circuitry, in operation, receives and processes transducer-echo signals amplified by the receiver.

12. The device of claim 8, comprising:
a receiver switch, wherein in operation, the control circuitry generates at least one control signal to open the receiver switch during transducer-driving periods and to close the receiver switch during echo-reception periods.

13. A system, comprising:
a transducer; and
a transmission channel, which, in operation, is coupled to the transducer, the transmission channel including:
a current generator circuit, which, in operation, generates current-integrator drive currents;
a current integrator, which, in operation, integrates current-integrator drive currents generated by current generator circuit to generate transducer drive signals; and
control circuitry, which, in operation, generates one or more control signals to control generation of current-integrator drive currents by the current generator circuit during transducer-driving periods.

14. The system of claim 13 wherein the transmission channel comprises:
a first current-generator switch; and
a second current-generator switch, wherein,
the current generator circuit comprises at least one first current generator and at least one second current generator;
the first current-generator switch is coupled between the at least one first current generator and an input of the current integrator; and
the second current-generator switch is coupled between the at least one second current generator and the input of the current integrator; and
the control circuitry, in operation, generates one or more control signals to selectively close the first and second current generator switches during transducer-driving periods.

15. The system of claim 13 wherein the control circuitry, in operation, generates one or more control signals to control magnitudes and directions of current-integrator drive currents generated by the current generator circuit.

16. The system of claim 15 wherein the current integrator comprises a high-voltage amplifier and a first capacitor.

17. The system of claim 16, comprising:
a receiver including a second current integrator having a low-voltage amplifier and a second capacitor.

18. The system of claim 13 wherein the transducer comprises a piezoceramic crystal and the transmission channel, in operation, transmits ultrasonic pulses to the transducer during transducer-driving periods.

19. The system of claim 13, comprising an integrated circuit including the current generator circuit and the control circuitry.

20. A method, comprising:
generating, using a current generator, a current-integrator drive current;
coupling the current generator to a current integrator during a transducer-driving period;
integrating, using the current integrator, the current-integrator drive current to generate a transducer-drive signal during the transducer-driving period; and
coupling an echo-receiver to the transducer during a transducer-echo reception period following the transducer-driving period.

21. The method of claim 20 wherein the generating the current-integrator drive current comprises controlling magnitudes and directions of current generated by the current generator circuit.

22. The method of claim 21 wherein,
the controlling magnitudes and directions of current generated by the current generator circuit comprises generating control signals to control first and second current-generator switches.

23. The method of claim 20, comprising generating control signals to control a receiver switch coupled between the current integrator and the echo-receiver.

24. A non-transitory computer-readable medium whose contents cause control circuitry to control a method, the method comprising:
  generating a current-integrator drive current;
  coupling the current-integrator drive current to a current integrator during a transducer-driving period;
  integrating the current-integrator drive current to generate a transducer-drive signal during the transducer-driving period; and
  coupling an echo-receiver to the transducer during a transducer-echo reception period following the transducer-driving period.

25. The medium of claim 24 wherein the generating the current-integrator drive current comprises controlling magnitudes and directions of current generated by a current generator circuit.

26. The medium of claim 25 wherein the method comprises generating control signals to control a receiver switch coupled between the current integrator and the echo-receiver.

* * * * *